United States Patent
Alapati

(10) Patent No.: US 11,588,009 B2
(45) Date of Patent: Feb. 21, 2023

(54) SEMICONDUCTOR DEVICE HAVING A LID CONFIGURED AS AN ENCLOSURE AND A CAPACITIVE STRUCTURE AND METHOD OF MANUFACTURING A SEMICONDUCTOR DEVICE

(71) Applicant: Amkor Technology, Inc., Tempe, AZ (US)

(72) Inventor: Ramakanth Alapati, Dublin, CA (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 262 days.

(21) Appl. No.: 16/218,423

(22) Filed: Dec. 12, 2018

(65) Prior Publication Data
US 2020/0194542 A1    Jun. 18, 2020

(51) Int. Cl.
| H01L 23/64 | (2006.01) |
| H01L 23/367 | (2006.01) |
| H01L 49/02 | (2006.01) |
| H01L 23/498 | (2006.01) |
| H01L 23/00 | (2006.01) |

(52) U.S. Cl.
CPC ........ *H01L 28/60* (2013.01); *H01L 23/49827* (2013.01); *H01L 23/642* (2013.01); *H01L 24/17* (2013.01); *H01L 23/3672* (2013.01)

(58) Field of Classification Search
CPC . H01L 28/60; H01L 23/49827; H01L 23/642; H01L 23/3672; H01L 24/17
See application file for complete search history.

(56) References Cited

U.S. PATENT DOCUMENTS

| 4,654,694 | A | * | 3/1987 | Val | H01L 23/642 |
| | | | | | 174/559 |
| 5,031,069 | A | * | 7/1991 | Anderson | H05K 1/162 |
| | | | | | 361/321.1 |
| 5,264,061 | A | * | 11/1993 | Juskey | B29C 64/135 |
| | | | | | 156/214 |
| 5,475,565 | A | * | 12/1995 | Bhattacharyya | H01L 23/04 |
| | | | | | 257/713 |
| 6,011,299 | A | * | 1/2000 | Brench | H01L 23/36 |
| | | | | | 257/E23.101 |
| 6,218,242 | B1 | * | 4/2001 | Tseng | H01L 28/91 |
| | | | | | 257/E21.648 |
| 6,777,777 | B1 | * | 8/2004 | Kar-Roy | H01L 23/5223 |
| | | | | | 257/310 |
| 7,115,988 | B1 | * | 10/2006 | Hool | |

(Continued)

*Primary Examiner* — Sophia T Nguyen
*Assistant Examiner* — Scott E Bauman
(74) *Attorney, Agent, or Firm* — Kevin B. Jackson

(57) ABSTRACT

A method for forming a packaged electronic device includes providing a substrate having a first major surface and an opposing second major surface. The method includes attaching an electronic device to the first major surface of the substrate and providing a first conductive structure coupled to at least a first portion of the substrate. The method includes forming a dielectric layer overlying at least part of the first conductive structure. The method includes forming a conductive layer overlying the dielectric layer and connected to a second portion of the substrate. The first conductive structure, the dielectric layer, and conductive layer are configured as a capacitor structure and further configured as one or more of an enclosure structure or a stiffener structure for the packaged electronic device.

20 Claims, 5 Drawing Sheets

(56) References Cited

U.S. PATENT DOCUMENTS

| | | | | |
|---|---|---|---|---|
| 2002/0114134 A1* | 8/2002 | Skinner | | H05K 9/0028 |
| | | | | 257/E23.101 |
| 2006/0060857 A1* | 3/2006 | Mardilovich | | H01L 29/4908 |
| | | | | 257/E29.151 |
| 2007/0221978 A1* | 9/2007 | Tsuji | | H01L 23/49537 |
| | | | | 257/306 |
| 2009/0021270 A1* | 1/2009 | Bandholz | | G01N 27/223 |
| | | | | 324/690 |
| 2010/0230806 A1* | 9/2010 | Huang | | H01L 21/565 |
| | | | | 257/723 |
| 2011/0018119 A1* | 1/2011 | Kim | | H01L 24/17 |
| | | | | 257/690 |
| 2012/0280374 A1* | 11/2012 | Choi | | H01L 23/49827 |
| | | | | 257/659 |
| 2013/0062679 A1* | 3/2013 | Manabe | | H01L 29/4236 |
| | | | | 257/306 |
| 2015/0243609 A1* | 8/2015 | Lamorey | | H01L 25/165 |
| | | | | 361/717 |
| 2016/0133686 A1* | 5/2016 | Liao | | H01G 4/306 |
| | | | | 257/532 |
| 2016/0336268 A1* | 11/2016 | Kamikura | | H01L 23/3114 |
| 2017/0018365 A1* | 1/2017 | Gustafson | | H01G 4/1227 |
| 2018/0053702 A1* | 2/2018 | Spory | | H01L 23/04 |
| 2018/0204783 A1* | 7/2018 | Han | | H05K 9/0088 |
| 2019/0057949 A1* | 2/2019 | Hwang | | H01L 23/50 |
| 2020/0185299 A1* | 6/2020 | Chang | | H01L 23/49816 |
| 2021/0168965 A1* | 6/2021 | Shi | | H01G 2/08 |

\* cited by examiner

SEMICONDUCTOR DEVICE HAVING A LID CONFIGURED AS AN ENCLOSURE AND A CAPACITIVE STRUCTURE AND METHOD OF MANUFACTURING A SEMICONDUCTOR DEVICE

CROSS-REFERENCE TO RELATED APPLICATIONS

Not Applicable.

BACKGROUND OF THE DISCLOSURE

The present disclosure relates, in general, to electronics, and more particularly, to semiconductor packages, structures thereof, and methods of forming semiconductor packages.

Prior semiconductor packages and methods for forming semiconductor packages are inadequate, for example resulting in excess cost, poor thermal performance, decreased reliability, relatively low performance, or package sizes that are too large. Further limitations and disadvantages of conventional and traditional approaches will become apparent to one of skill in the art, through comparison of such approaches with the present disclosure and reference to the drawings.

More particularly, some semiconductor packages include passive components in combination with one or more semiconductor die. In the past, the passive components, such as capacitors, were mounted on a package substrate laterally adjacent to the semiconductor die, which was also mounted to the package substrate. This conventional assembly approach consumed valuable substrate space and significantly increased the overall size of the semiconductor package. Next generation semiconductor packages will require a significant increase in total capacitance value per package, which will significantly grow the size of such packages formed using the conventional assembly approach.

Accordingly, it is desirable to have a package structure and a method that provides a packaged electronic device that overcomes the shortcomings of the prior art. It is also desirable for the structure and method to be easily incorporated into manufacturing flows, accommodate multiple die interconnect schemes, and to be cost effective.

BRIEF SUMMARY

The present description includes, among other features, a packaged electronic device structure and associated method that comprises one or more capacitor structures embedded within or as part of lid or stiffener components. In some examples, 3D printing techniques are used to provide one or more portions of the capacitor structures. The structure and method provide a higher capacity capacitor(s), which reduces bill-of-material counts and increases assembly yields by, for example, shrinking package size. In some examples, the present description provides a capacitive structure that replaces one 0201 capacitor for every 25 square millimeter (mm²) of lid area. For example, a 65 mm×65 mm lid in accordance with the present description can provide the equivalent capacitance of about 170 0201 capacitors without requiring the substrate space necessary for that many 0201 capacitors.

More particularly, in one example, a method for forming a packaged electronic device includes providing a substrate having a first major surface and an opposing second major surface. The method includes attaching an electronic device to the first major surface of the substrate and providing a first conductive structure coupled to at least a first portion of the substrate. The method includes forming a dielectric layer overlying at least part of the first conductive structure. The method includes forming a conductive layer overlying the dielectric layer and connected to a second portion of the substrate. The first conductive structure, the dielectric layer, and conductive layer are configured as a capacitor structure and further configured as one or more of an enclosure structure or a stiffener structure for the packaged electronic device.

In another example, a method for forming a packaged electronic device includes providing a substrate. The method includes electrically coupling an electronic device to the substrate, providing a first conductive structure coupled to a first portion of the substrate, wherein the first conductive structure has an upper surface that is disposed outward from the substrate. The method includes providing a dielectric structure overlying at least a part of the upper surface of the first conductive structure. The method includes providing a conductive layer overlying the dielectric structure and coupled to a second portion of the substrate such that the conductive layer has a first portion that overlaps the dielectric structure and a second portion that is coupled to the substrate, wherein the first conductive structure, the dielectric structure, and conductive layer comprise a capacitor structure. In one example, the first conductive structure comprises a lid structure that is configured as an enclosure structure that covers the electronic device. In another example, the first conductive structure, the dielectric structure, and conductive layer are configured a stiffener structure for the packaged electronic device.

In a further example, a packaged electronic device structure includes a substrate and an electronic device electrically coupled the substrate. A first conductive structure is coupled to at least a first portion of the substrate and a dielectric structure overlies at least part of the first conductive structure. A conductive layer overlies the dielectric layer and is coupled to a second portion of the substrate, wherein the first conductive structure, the dielectric layer, and the conductive layer are configured as a capacitor structure and are further configured as one or more of an enclosure structure or a stiffener structure.

Other examples are included in the present disclosure. Such examples may be found in the figures, in the claims, and/or in the description of the present disclosure.

Figure 1:
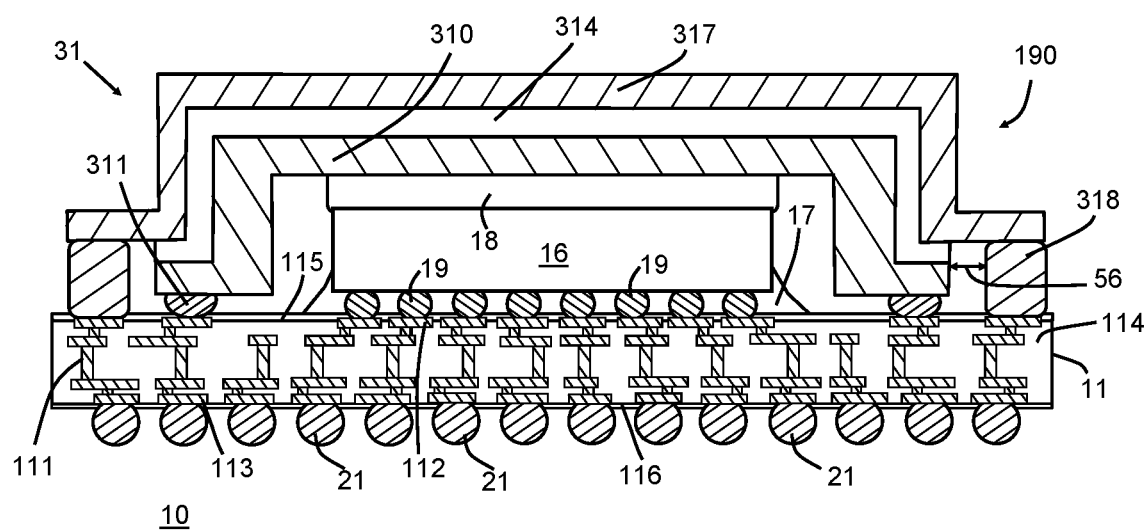
FIG. 1 illustrates a cross-sectional view of an example packaged electronic device of the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular example embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one example" or "an example" means that a particular feature, structure or characteristic described in connection with the embodiment is included in at least one example of the present invention. Thus, appearances of the phrases "in one example" or "in an example" in various places throughout this specification are not necessarily all referring to the same example, but in some cases it may. Furthermore, the particular features, structures or characteristics may be combined in any suitable manner, as would be apparent to one of ordinary skill in the art, in one or more example embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the examples illustrated and described hereinafter suitably may have examples and/or may be practiced in the absence of any element that is not specifically disclosed herein.

DETAILED DESCRIPTION OF THE DRAWINGS

FIG. 1 illustrates a cross-sectional view of an example packaged electronic device 10, such as a packaged semiconductor device 10 in accordance with the present description. The example is illustrated as a ball-grid array (BGA) packaged semiconductor device structure, but the description is not limited to this type of package. In the example illustrated in FIG. 1, packaged semiconductor device 10 comprises a substrate 11, an electronic component 16, such as a semiconductor device 16, a protective layer 17, an attachment material 18, conductive interconnect structures 19 and 21, and a capacitor structure 31. In accordance with the present description and the present example, capacitor structure 31 is configured as both a capacitive device and as a structure that encloses and protects semiconductor device 16.

Conductive interconnect structures 19 and 21, substrate 11, protective layer 17, attachment material 18, and capacitor structure 31 can be referred to as a semiconductor package 190, and package 190 can provide protection for semiconductor device 16 from external elements and/or environmental exposure. In addition, semiconductor package 190 can provide electrical coupling from external electrical components (not shown) to conductive interconnect structures 19 and semiconductor device 16.

Semiconductor device 16 can be attached to capacitor structure 31 with attachment material 18, which can be an insulating material, a thermally conductive and electrically conductive material, or a thermally conductive and electrically non-conductive material. In some examples, attachment material 18 comprises a dielectric material, such as aluminum oxide, zirconium oxide, hafnium oxide, or similar materials as known to those skilled in the art. Semiconductor device 16 can be further electrically connected to substrate 11 using interconnect structures 19, which can comprise solder balls, solder bumps, copper bumps, nickel gold bumps, or similar materials as known to one of ordinary skill in the art. Protective layer 17 can include underfill materials configured to reduce interconnect strain levels with conductive interconnect structures 19. Such materials can include a mixture of liquid organic resin binder and inorganic fillers and can be formed using, for example, capillary dispensing techniques.

Substrate 11 can be selected from common circuit boards (for example, rigid circuit boards and flexible circuit boards), multi-layer substrates, laminate substrates, core substrates with build-up layers, coreless substrates, ceramic substrates, lead frame substrates, molded lead frame substrates, or similar substrates as known to one of ordinary skill in the art. In this regard, the present description is not intended to be limited to any particular type of substrate 11. By way of example and not by way of limitation, the substrate 11 may include an insulating structure 114 having opposed, generally planar top and bottom surfaces. It is understood that multiple insulating layer portions can be used to provide insulating structure 114. An electrically conductive pattern 112 or conductive pattern layer 112 can be disposed adjacent to the top surface of insulating structure 114, and conductive lands 113 can be disposed adjacent to the bottom surface of insulating structure 114.

Conductive pattern 112 and conductive lands 113 are electrically interconnected to each other in a prescribed pattern or arrangement using conductive interconnect paths 111, defined by portions of one or more conductive layers, that extend through the insulating structure 114 from conductive pattern 112 to conductive lands 113. Conductive pattern 112, conductive lands 113, and conductive interconnect layers 111 comprises conductive materials, such as one or more metals. In some examples, conductive pattern 112, conductive lands 113, and conductive interconnect layers 111 comprise copper. In some examples, a solder mask 115 can be provided adjacent to at least portions of conductive pattern 112 and the top surface of insulating structure 114. In addition, in some examples a solder mask 116 can be provided on at least portions of the lands 113 and the bottom surface of insulating structure 114. The solder mask 115 is used to protect portions of conductive pattern 112 that would otherwise be susceptible to electrical shorting issues. The solder mask 116 is used to protect portions of the lands 113 that would otherwise be exposed to the ambient environment.

Semiconductor device 16 can be attached to a portion of conductive pattern 112 with conductive interconnect structures 19 in a flip-chip configuration. In other examples, semiconductor device 16 can be attached to substrate 11 in a device active region up (or die up) configuration, and wire bonds can be used to electrically connect semiconductor device 16 to conductive pattern 112. In some examples, conductive interconnect structures 21 can be attached to conductive lands 113, and can comprise conductive materials, such as solder balls, solder bumps, copper bumps, nickel gold bumps, or similar materials as known to one of ordinary skill in the art. In other examples, conductive lands 113 can be configured to directly connect or attach to a next level of assembly, such as a printed circuit board.

In some examples, semiconductor device 16 is an integrated circuit device, a power semiconductor device, an optical device, any type of sensor device, or other devices as known to those skilled in the art. Those of ordinary skill in the art will appreciate that semiconductor device 16 is illustrated in simplified form, and may further include multiple diffused regions, multiple conductive layers, and multiple dielectric layers.

In accordance with the present example, capacitor structure 31 comprises a lid structure 310, a cap structure 310, a first conductive structure 310, a first conductive layer 310, an electrode layer 310, or an enclosure structure 310, which comprises a conductive material, such as a metal. In some examples, lid structure 310 comprises copper; aluminum; metal alloy materials, such as ASTM-F15 alloys (Kovar 42, 46, 48, and 49), 300/400 Series stainless steel; clad materials, such as aluminum-copper; metal coated ceramic materials; or other similar materials as known to those of ordinary skill in the art. In some examples, lid structure 310 can be attached to conductive pattern 112 using an attachment layer 311, which can comprise a conductive material such as solder materials, adhesives, epoxies, or similar materials as known to one of ordinary skill in the art. In some examples, lid structure 310 can be provided using stamping, punching, drawing, etching, laser trimming, and/or plating techniques.

In addition, capacitor structure 31 comprises a dielectric layer 314, dielectric structure 314, or dielectric region 314 disposed to overlie an upper surface of lid structure 310. In some examples, dielectric layer 314 comprises an oxide material, such as aluminum oxide, zirconium oxide, hafnium oxide, or similar materials as known to one of ordinary skill in the art. In one example, dielectric layer 314 can be zirconium oxide in a polymeric suspension (for example, polyvinylpyrrolidone (PVP)), and can have a thickness in a range from about 2 microns through about 5 microns.

In some examples, dielectric layer 314 is provided using 3D printing techniques, which generally refers to a method where an additive process is used to form a three-dimensional object based on a digitally created file of the object. More particularly, the object can be created by laying down many thin layers of a material in succession using a 3D printing apparatus. Examples of types of 3D printing include metal printing, such as selective laser melting (SLM) and electron beam melting (EBM); selective laser sintering (SLS); jetting processes, stereolithography (SLA); and fusion deposition modeling (FDM). In other examples, dielectric layer 314 can be formed using deposition, coating, or screen-printing techniques. In further examples, dielectric layer 314 can include one or more layers comprising different materials. In some examples, lid structure 310 also can be formed using 3D printing techniques.

Capacitor structure 31 further comprises a conductive electrode layer 317, top electrode layer 317, or second conductive layer 317 disposed to overlie dielectric layer 314, such as an upper or outer surface of dielectric layer 314. In some examples, conductive layer 317 comprises one or more metal materials, such as copper, gold, silver, stainless steel, or other similar materials as known to one of ordinary skill in the art. In some examples, a conductive stud structure 318, conductive structure 318, or conductive structures 318 can be used to connect or attach conductive layer 317 to substrate 11. In some examples, conductive structure 318 is attached to a portion of conductive pattern 112 of substrate 11 as generally illustrated in FIG. 1 and can comprise similar materials to conductive layer 317. Conductive structure 318 is configured to provide an attachment location or stand-off structure for conductive layer 317. Conductive structure 318 can be formed or disposed directly onto conductive pattern 112, such as by 3D printing, without an intervening attachment layer as generally illustrated in FIG. 1. In other examples, conductive structure 318 can be attached to substrate 11 using attachment layer 311.

In some examples, conductive layer 317 is provided using 3D printing. In an example, conductive layer 317 is provided such that it overlaps an air gap 56 that can be less than about 50 microns between an outer edge of lid structure 310 and/or of dielectric layer 314, and an inner edge of conductive structure 318. In another example, gap 56 is less than about 30 microns. The dimensions of gap 56 are particularly suitable in permitting the use of 3D printing techniques, which can allow for certain spanning of voids. In other examples, conductive layer 317 is provided as an outer lid structure that incorporates a connection structure for attaching the outer lid structure to substrate 11. There can be examples where conductive structure 318 can be formed in the same process or step as conductive layer 317, and/or where conductive structure 318 can be integral with and/or comprise a portion of conductive layer 317.

In accordance with the present example, capacitor structure 31 is configured as a parallel plate capacitor where the capacitance value is dependent upon the area of the plates (that is, the overlapping area of conductive layer 317 and lid structure 310) and the thickness (that is, distance between conductive layer 317 and lid structure 310) and the relative permittivity of dielectric layer 314. By providing capacitor structure 31 configured in accordance with the present description, packaged semiconductor device 10 can be provided with higher capacitance without increasing the lateral size of substrate 11 as in previous devices. Another advantage of capacitor structure 31 is that it is provided as a structure that can provide a capacitor functionality, an EMI (Electro-Magnetic Interference) shielding functionality, and/or a protective functionality by enclosing semiconductor device 16. More particularly, capacitor structure 31 is configured as both a capacitor structure and an enclosure structure that encloses semiconductor device 16.

Figure 2:
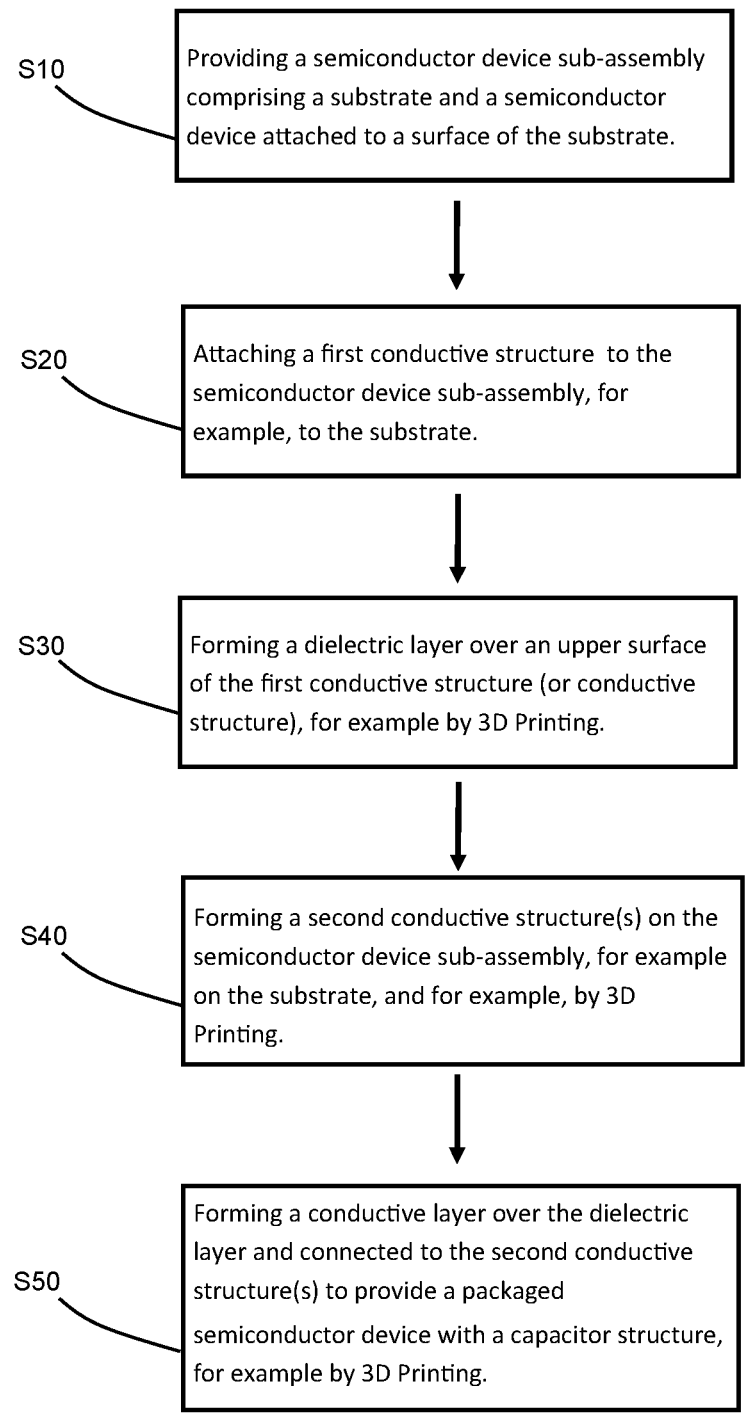
FIG. 2 is a flow chart of an example method of forming a packaged electronic device of the present description.

FIG. 2 is a flow chart illustrating an example method 200 for manufacturing packaged semiconductor device 10 in accordance with the present description, and FIGS. 3-6 illustrate cross-sectional views of packaged semiconductor device 10 at various stages of manufacture in accordance with FIG. 2. In a Block S10, a semiconductor device sub-assembly is provided that includes a substrate and semiconductor device attached to a surface of the substrate. In a Block S20, a first conductive structure is attached to the semiconductor sub-assembly, such as the substrate.

Figure 3:
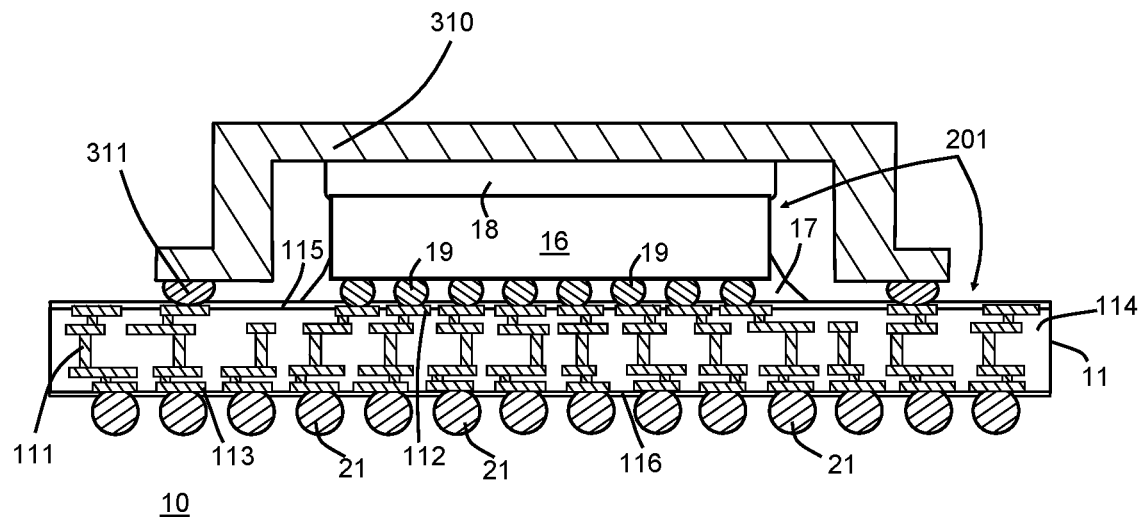
FIGS. 3-6 illustrate cross-sectional views of packaged electronic device at various stages of manufacture in accordance with the present description.

FIG. 3 illustrates packaged semiconductor device 10 at a stage of manufacture and further illustrates an example of Block S10 and Block S20 of FIG. 2. A semiconductor device sub-assembly 201 is provided where the substrate can be similar to substrate 11 of FIG. 1 (or variations thereof), and the semiconductor device can be similar to semiconductor device 16 of FIG. 1 (or variations thereof). In one example, interconnect structures 19 can be used to attach semiconductor device 16 to conductive pattern 112 on substrate 11.

Interconnect structures 19 can comprises solder bumps, metal bumps, such as silver bumps, gold bumps or copper bumps, or other conductive structures as known to one of ordinary skill in the art. In the present example, protective layer 17 can be added before or after semiconductor device 16 is attached to substrate 11 so that protective layer 17 is interposed between semiconductor device 16 and substrate 11. In some examples, protective layer 17 can be formed using capillary dispensing techniques and can comprise materials such as include a mixture of liquid organic resin binder and inorganic fillers. In some examples, protective layer 17 can include a flux material for assisting in the reflow process of interconnect structure 19. In some examples, conductive interconnect structures 21 can be attached to conductive lands 13. Conductive interconnect structures 21 can be metal bumps including solder bumps or other conductive structures as known to one of ordinary skill in the art. In other examples, conductive interconnect structures 21 can be excluded and conductive lands 113 configured to attach to a next level of assembly.

In accordance with Block S20 of method 200, a first conductive structure, such as lid structure 310 is attached to substrate 11, and in some examples, is further attached to semiconductor device 16 using attachment material 18. In some examples, lid structure 310 comprises copper; aluminum; metal alloy materials, such as ASTM-F15 alloys (Kovar 42, 46, 48, and 49), 300/400 Series stainless steel; clad materials, such as aluminum-copper; metal coated ceramic materials; or other similar materials as known to those of ordinary skill in the art. In one example, attachment material 18 can be formed using 3D printing techniques (e.g., 3D printed onto semiconductor device 16 or lid structure 310) and can comprise a dielectric material, such as aluminum oxide, zirconium oxide, hafnium oxide, or similar materials as known to those skilled in the art. In some examples, lid structure 310 is electrically connected to a portion of conductive pattern 112 of substrate 11 using, for example, attachment layer 311, which can comprise a conductive material such as solder materials, adhesives, epoxies, or similar materials as known to one of ordinary skill in the art. In some examples, lid structure 310 can be electrically connected through conductive pattern 112 to semiconductor device 16. In the same or other examples, lid structure 310 can be electrically connected to an external device through conductive pattern 112, conductive interconnect layers 111, conductive lands 113, and conductive interconnect structures 21.

Figure 4:
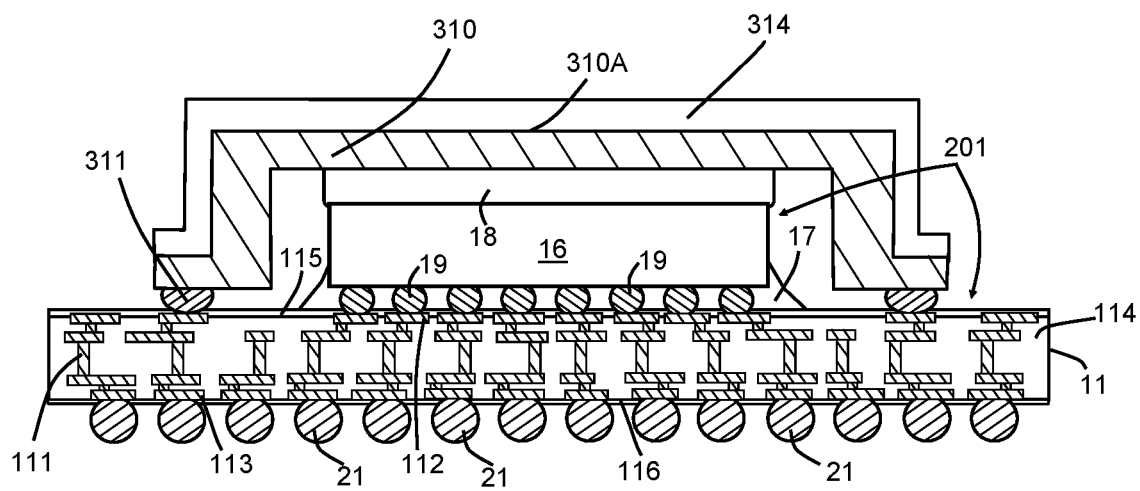

Method 200 also includes a Block S30 of forming a dielectric layer overlying an upper surface of the first conductive structure. FIG. 4 illustrates packaged semiconductor device 10 after processing in accordance with Block S30 of method 200. In some examples, sub-assembly 201 with lid structure 310 is placed within a 3D printing apparatus and dielectric layer 314 is provided overlying an upper or outer surface 310A of lid structure 310. In some examples, dielectric layer 314 comprises an oxide material, such as aluminum oxide, zirconium oxide, hafnium oxide, or similar materials as known to one of ordinary skill in the art. In one example, dielectric layer 314 can be zirconium oxide in a polymeric suspension (for example, PVP), and can have at thickness in a range from about 2 microns through about 5 microns. In other examples, dielectric layer 314 can be formed using deposition, coating, or screen-printing techniques. In further examples, dielectric layer 314 can include one or more different layers of materials. In some examples, dielectric layer 314 can extend further to cover a portion of the lower sidewall of lid structure 310. In the same or other examples, dielectric layer 314 can extend further to reach the top surface of substrate 11.

Figure 5:
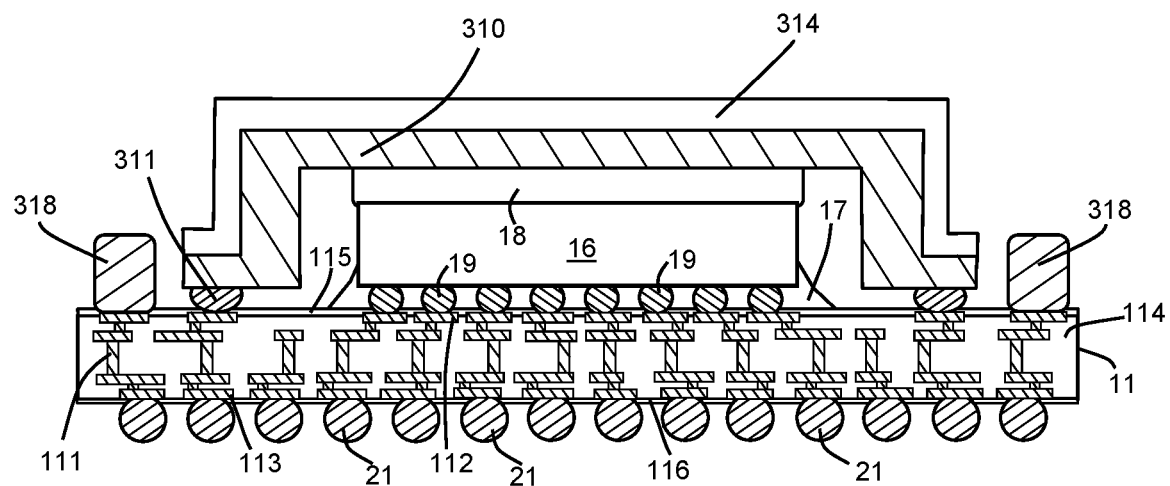

Method 200 includes a Block S40 of forming a second conductive structure on the semiconductor device sub-assembly, such as the substrate. FIG. 5 illustrates packaged semiconductor device 10 after processing in accordance with Block S40 of method 200. In some examples, the second conductive structure of Block S40 can include conductive structure 318 of FIG. 1, which can be formed on a portion of substrate 11 laterally spaced apart from semiconductor device 16. In some examples, conductive structure 318 is a continuous structure that laterally surrounds semiconductor device 16 without interruptions or breaks. In one example, conductive structure 318 is formed using 3D printing techniques, and can comprise one or more metal materials, such as copper, gold, silver, stainless steel, or other similar materials as known to one of ordinary skill in the art. In some examples, conductive structure 318 is electrically connected to another portion of conductive pattern 112 of substrate 11 and can be electrically connected to semiconductor device 16 and/or an external device through conductive pattern 112, conductive interconnect layers 111, conductive lands 113, and conductive interconnect structures 21.

Figure 6:
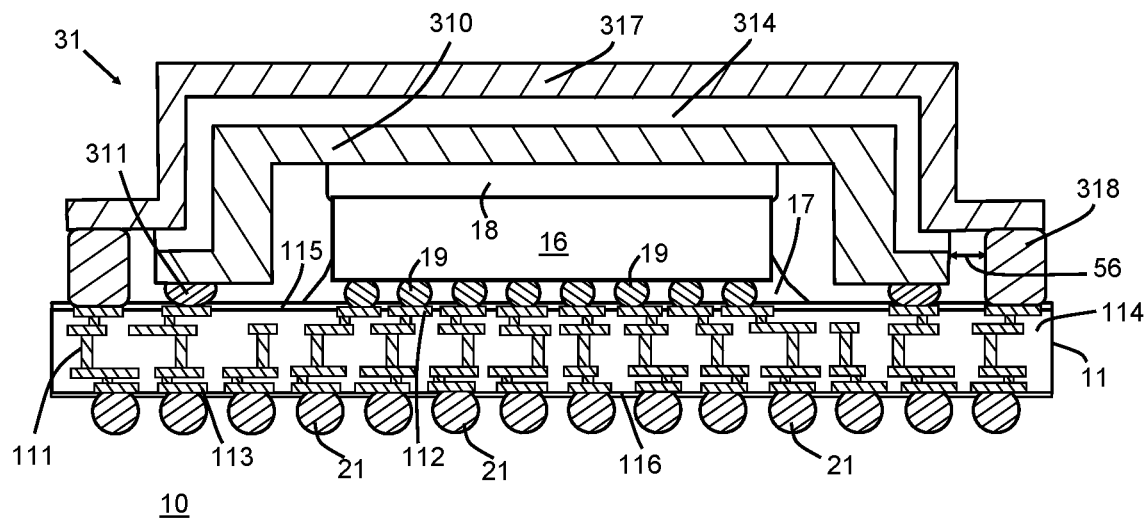

Method 200 includes a Block S50 of forming a conductive layer over the dielectric layer and connected to the second conductive structure. FIG. 6 illustrates packaged semiconductor device 10 after processing in accordance with Block S50 of method 200. The conductive layer of Block S50 can include conductive layer 317 of FIG. 1. In some examples, conductive layer 317 comprises one or more metal materials, such as copper, gold, silver, stainless steel, or other similar materials as known to one of ordinary skill in the art. Conductive layer 317 can comprise one or more sub-layers of any such one or more metal materials stacked upon each other. In some examples, conductive layer 317 is provided using 3D printing. In an example, conductive layer 317 is provided such that it overlaps air gap 56, which can be less than or equal to about 50 microns. In another example, gap 56 is less than or equal to about 30 microns. In one example, a single 3D printing step is used to provide both conductive structure 318 and conductive layer 317 as an integral structure.

In accordance with method 200, a packaged semiconductor device 10 is provided with capacitor structure 31, which includes lid structure 310, dielectric layer 314, and conductive layer 317. In some examples of method 200, 3D printing techniques are used to provide one or more (including all) of attachment layer 18, dielectric layer 314, conductive structure 318, and conductive layer 317.

Figure 7:
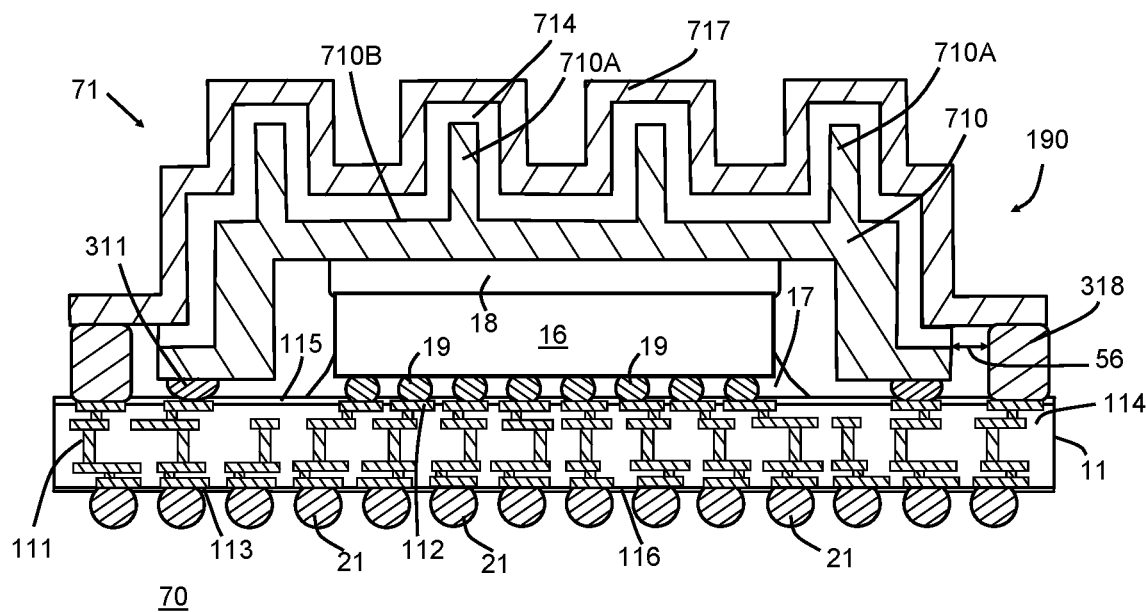
FIG. 7 illustrates a cross-sectional view of an example packaged electronic device of the present description.

FIG. 7 illustrates a cross-sectional view of an example packaged electronic device 70, such as a packaged semiconductor device 70. Packaged semiconductor device 70 is another example, of a semiconductor package 190 in accordance with the present description. Packaged semiconductor device 70 is similar to packaged semiconductor device 10 and only the differences will be described hereinafter. Packaged semiconductor device 70 comprises a capacitor structure 71 that is different than capacitor structure 31 of packaged semiconductor device 10 illustrated in FIG. 1. In accordance with the present description, capacitor structure 71 comprises a lid structure 710, a cap structure 710, a first conductive layer 710, an electrode layer 710, or an enclosure structure 710, which comprises one or more fin structures 710A that extend outward from an outer surface 710B of lid structure 710. Fin structures 710A are configured to provide capacitor structure 71 with increased conductive plate surface area, and thus, a higher capacitance structure without an increase in lateral dimensions. The number of fins can be increased or decreased depending desired capacitance values.

Similar to lid structure 310, lid structure 710 comprises a conductive material, such as a metal. In some examples, lid structure 710 comprises copper; aluminum; metal alloy materials, such as ASTM-F15 alloys (Kovar 42, 46, 48, and 49), 300/400 Series stainless steel; clad materials, such as aluminum-copper; metal coated ceramic materials; or other similar materials as known to those of ordinary skill in the art.

In addition, capacitor structure 71 further comprises a dielectric layer 714, dielectric structure 714, or dielectric region 714 disposed to overlie lid structure 710 including fin structures 710A. That is, dielectric layer 714 conforms to the shape of lid structure 710. Dielectric layer 714 can comprise similar materials as previously described for dielectric layer 314 of packaged semiconductor device 10. In an example, dielectric layer 714 is formed using 3D printing techniques.

Capacitor structure 71 further comprises a conductive electrode layer 717, top electrode layer 717, or second conductive layer 717 disposed to overlie dielectric layer 714 and lid structure 710 including fin structures. That is, conductive layer 717 conforms to shapes of dielectric layer 714 and lid structure 710. Conductive layer 717 can comprise similar materials as previously described for conductive layer 317 of packaged semiconductor device 10. Like capacitor structure 31, conductive structure 318 can be used to connect or attach conductive layer 717 to substrate 11. In an example, conductive layer 717 is formed using 3D printing techniques. In the same or other examples, conductive layer 717 is provided such that it overlaps air gap 56 that can be less than or equal to about 50 microns. In another example, gap 56 is less than or equal to about 30 microns. These dimensions are suitable for 3D printing techniques, which can allow for certain spanning of voids, in the formation of conductive layer 717.

Method 200 described in FIG. 2 can be used to form packaged semiconductor device 70. By way of example, the first conductive structure of Block S20 can be lid structure 710 with one or more fin structures 710A; the dielectric layer of Block S30 can be dielectric layer 714; the second conductive structure of Block S40 can be conductive structure 318; and the conductive layer of Block S50 can be conductive layer 717.

Figure 8:
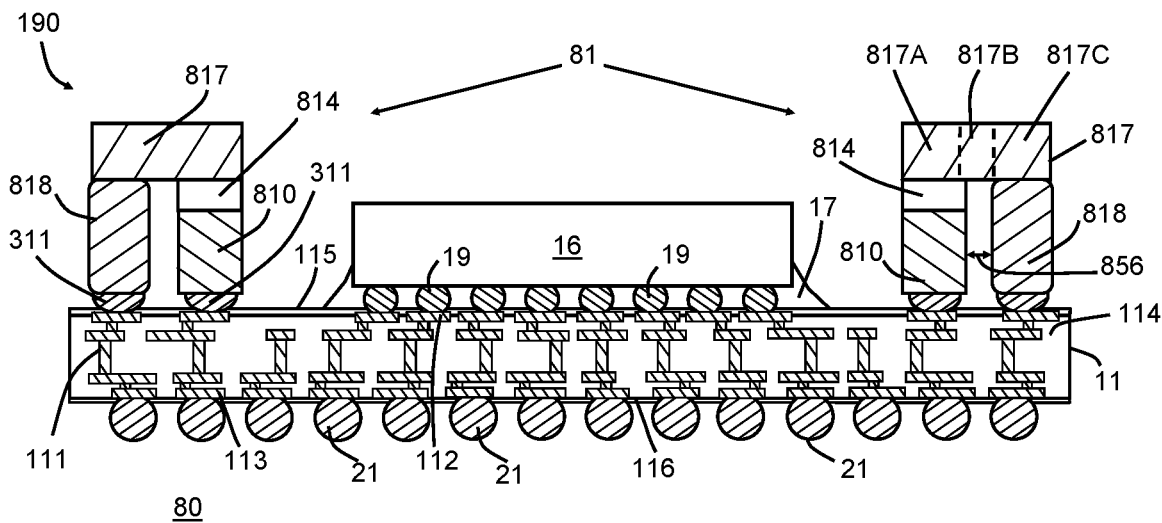
FIG. 8 illustrates a cross-sectional view of an example packaged electronic device of the present description.

FIG. 8 illustrates a cross-sectional view of an example packaged electronic device 80, such as a packaged semiconductor device 80. Packaged semiconductor device 80 is another example of a semiconductor package 190 in accordance with the present description. Packaged semiconductor device 80 is similar to packaged semiconductor device 10, and only the differences will be described hereinafter. Packaged semiconductor device 80 comprises a capacitor structure 81 that is different than capacitor structure 31 of packaged semiconductor device 10. In accordance with the present description, capacitor structure 81 is provided configured as a stiffener structure or stiffener ring structure for substrate 11.

In some examples, capacitor structure 81 is disposed on substrate 11 in a peripheral location that is laterally separated from side edges of semiconductor device 16 in a cross-sectional view as generally illustrated in FIG. 8. More particularly, capacitor structure 81 can be configured as a continuous ring-like structure that laterally surround semiconductor device 16 without breaks or interruptions. Capacitor structure 81 comprises a conductive layer 810, first conductive structure 810, first conductive electrode structure 810, or conductive structure 810. In some examples, conductive structure 810 can provide the stiffener structure qualities for substrate 11, and can comprise one or more metal materials, such as copper, gold, silver, stainless steel, or other similar materials as known to one of ordinary skill in the art. In some examples, conductive structure 810 can be attached to conductive pattern 112 using attachment layer 311, which can comprise a conductive material such as solder materials, adhesives, epoxies, or similar materials as known to one of ordinary skill in the art. In one example, conductive structure 810 is formed using 3D printing techniques. In other examples, conductive structure 810 can formed using plating, evaporation, sputtering, or other deposition techniques. In further examples, conductive structure and be disposed directly onto conductive pattern 112 without an intervening attachment layer. One difference between conductive structure 810 and conductive structure 310 is that conductive structure 810 is not configured to laterally overlap any portion of semiconductor device whereas conductive structure 310 completely laterally overlaps semiconductor device 16.

Capacitor structure 81 also comprises a dielectric layer 814, dielectric structure 814, or dielectric region 814 disposed to overlie an upper surface of conductive structure 810. In some examples, dielectric layer 814 comprises an oxide material, such as aluminum oxide, zirconium oxide, hafnium oxide, or similar materials as known to one of ordinary skill in the art. In one example, dielectric layer 814 can be zirconium oxide in a polymeric suspension (for example, polyvinylpyrrolidone (PVP)), and can have at thickness in a range from about 2 microns through about 5 microns. In one example, dielectric layer 814 is formed using 3D printing techniques. In other examples, dielectric layer 814 can be formed using deposition, coating, or screen-printing techniques. In further examples, dielectric layer 814 can include one or more different layers of material.

Capacitor structure 81 further comprises a conductive electrode layer 817, top electrode layer 817, or second conductive layer 817 disposed to overlie dielectric layer 814. In some examples, conductive layer 817 comprises one or more metal materials, such as copper, gold, silver, stainless steel, or other similar materials as known to one of ordinary skill in the art. In some examples, a conductive stud structure 818 or conductive structure 818 can be used to connect or attach conductive layer 817 to substrate 11. In some examples, conductive structure 818 is attached to a portion of conductive pattern 112 as generally illustrated in FIG. 8, and can comprise materials that are similar to conductive layer 817. Conductive structure 818 can be attached to substrate 11 with attachment layer 311. In other examples, conductive structure 818 can be disposed directly onto conductive pattern 112 without an intervening attachment layer. In some examples, conductive layer 817 and conductive structure 818 are formed using 3D printing techniques. In the same or other examples, example, conductive layer 817 is provided such that it overlaps an air gap 856 that can be less than about 50 microns. In another example, gap 856 is less than about 30 microns. The dimensions of gap 856 are suitable for 3D printing techniques, which can allow for certain spanning of voids, in the formation of conductive layer 817. Although the present example shows conductive structure 810 inwards of conductive structure 818 over substrate 11, there can be examples where such relationship can be flipped, for example, to permit adjustment of the stiffening effect that of capacitor structure 81 has on substrate 11.

As generally illustrated in FIG. 8, conductive layer 817 comprises a first portion 817A that directly laterally overlaps dielectric layer 814 and conductive structure 810 in a cross-sectional view, comprises a second portion 817B that overlaps gap 856 in the cross-sectional view, and further comprises a third portion 817C that laterally overlaps conductive structure 818 in the cross-sectional view. In other examples, conductive layer 817 and conductive structure 818 can be a single piece or an integrated structure. In further examples, packaged semiconductor device 80 can include a package body comprising, for example, an encapsulant material that encapsulates at least semiconductor device 16.

In accordance with the present description, capacitor structure 81 provides multiple functions including a capacitive function and a stiffening function for packaged semiconductor device 80. This allows for more functionality for packaged semiconductor devices, which use separate stiffener structures and capacitors, in less package space because additional capacitive structures that occupy space on substrate 11 in previous devices can be replaced by capacitor structure 81 that also provides the functionality of the stiffener structure. In other examples, capacitor structure 81 can be combined with capacitor structure 31 or a capacitor structure 71 in a packaged electronic device.

Method 200 described in FIG. 2 can be used to form packaged semiconductor device 80. By way of example, the first conductive structure of Block S20 can be conductive structure 810; the dielectric layer of Block S30 can be dielectric layer 814; the second conductive structure of Block S40 can be conductive structure 818; and the conductive layer of Block S50 can be conductive layer 817.

In summary, methods for forming a packaged electronic device and related packaged electronic device structures have been disclosed including a capacitor structure. In one example, the capacitor structure is configured as part of a conductive lid structure. In another example, the capacitor structure is part of a stiffener structure. In accordance with a method, 3D printing is used to form one or more portions of the capacitor structure. The structure and method provide a higher capacity capacitor(s), which reduces bill-of-material counts and increases assembly yields by, for example, shrinking package size. In some examples, the present description provides a capacitive structure that replaces one 0201 capacitor for every 25 mm² of lid area. For example, a 65 mm by 65 mm lid in accordance with the present description can provide the equivalent capacitance of about 170 0201 capacitors without requiring the substrate space necessary for that many 0201 capacitors.

While the subject matter of the invention is described with specific example steps and example embodiments, the foregoing drawings and descriptions thereof depict only typical examples of the subject matter, and are not therefore to be considered limiting of its scope. It is evident that many alternatives and variations will be apparent to those skilled in the art. By way of example, multiple electronic devices can be attached to a pad in side-by-side configurations, in stacked configurations, combinations thereof, or other configurations known to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A method for forming a packaged electronic device, comprising:
    providing a substrate comprising a first major surface and an opposing second major surface;
    attaching an electronic device to the first major surface of the substrate;
    attaching a single-piece lid structure to a first portion of the first major surface of the substrate, the single-piece lid structure comprising a conductive material, a top portion, and side portions extending downward from the top portion to vertically overlap sides of the electronic device to form an enclosure structure that vertically and horizontally covers the electronic device;
    after the step of attaching the single-piece lid structure:
        forming a dielectric layer on the top portion and on the side portions of the single-piece lid structure; and
        forming a conductive layer on the dielectric layer that is on the top portion of the single-piece lid structure, on the dielectric layer that is on the side portions of the single-piece lid structure and electrically coupled to a second portion of the first major surface of the substrate, wherein:
            the single-piece lid structure is electrically coupled to the substrate;
            the side portions and the top portion of the single-piece lid structure form a first capacitive plate;
            the dielectric layer on the top portion of the single-piece lid structure and on the side portions of the single-piece lid structure forms a capacitor dielectric;
            the conductive layer on the dielectric layer that is on the top portion of the single-piece lid structure and on the dielectric layer that is on the side portions of the single-piece lid structure forms a second capacitive plate; and
            the first capacitive plate, the capacitor dielectric, and the second capacitive plate form a capacitor structure for the packaged electronic device.

2. The method of claim 1, wherein:
    attaching the single-piece lid structure comprises:
        providing the single-piece lid structure comprising an edge portion that projects outward from the side portions of the single-piece lid structure; and
        attaching the edge portion to the first portion of the first major surface of the substrate so that the single-piece lid structure surrounds the electronic device without a break.

3. The method of claim 1, wherein:
    providing the substrate comprises providing the substrate including a first conductive pattern and a second conductive pattern;
    attaching the single-piece lid structure comprises attaching the single-piece lid structure to the first conductive pattern; and
    forming the conductive layer comprises electrically coupling the conductive layer to the second conductive pattern using a conductive structure.

4. The method of claim 1, wherein:
    attaching the single-piece lid structure comprises attaching the single-piece lid structure to the electronic device with an attachment layer; and forming the conductive layer comprises attaching a second lid structure to the first major surface of the substrate and to the dielectric layer.

5. The method of claim 4, wherein:
attaching the second lid structure comprises attaching the second lid structure using a conductive structure that is integral with the second lid structure.

6. The method of claim 1, wherein:
attaching the single-piece lid structure comprises attaching the single-piece lid structure including a fin structure that extends outward from the top portion of the single-piece lid structure and forms part of the first capacitive plate; and
the dielectric layer and the conductive layer cover the fin structure.

7. The method of claim 1, wherein:
forming the dielectric layer comprises 3D printing the dielectric layer.

8. The method of claim 7, wherein:
forming the dielectric layer comprises forming using zirconium oxide in a polymeric suspension; and
the dielectric layer has a thickness in a range from about 2 microns through about 5 microns.

9. The method of claim 1, wherein:
the method further comprises forming a second conductive structure adjacent to the first major surface of the substrate so that an outer edge of the single-piece lid structure and an inner edge of the second conductive structure define an air gap;
forming the conductive layer comprises 3D printing the conductive layer over the dielectric layer and over the second conductive structure; and
the air gap is less than about 50 microns.

10. The method of claim 1, wherein:
the dielectric layer and the conductive layer are formed using 3D printing.

11. A method for forming a packaged electronic device, comprising:
providing a substrate;
electrically coupling an electronic device to the substrate;
attaching a single-piece lid structure to the substrate overlying the electronic device, the single-piece lid structure comprising a conductive structure having a top portion and a side portion that extends from the top portion, wherein:
the single-piece lid structure forms an enclosure structure that vertically and horizontally encloses the electronic device; and
the single-piece lid structure comprises one or more fin structures extending outward from the top portion in a direction perpendicular from, overlying, and above a top side of the electronic device;
providing a dielectric structure on the top portion of the single-piece lid structure, on the side portion of the single piece lid structure, and on the one or more fin structures; and
providing a conductive layer on the dielectric structure that is on the top portion of the single-piece lid structure, on the dielectric structure that is on the side portion of the single-piece structure, on the dielectric that is on the one or more fin structures, and coupled to the substrate such that the conductive layer has a first portion that is on the dielectric structure and a second portion that is attached to the substrate, wherein:
the side portion, the top portion, and the one or more fin structures of the single-piece lid structure form a first capacitive plate;
the dielectric structure on the top portion of the single-piece lid structure, on the side portion of the single piece lid structure, and on the one or more fin structures; forms a capacitor dielectric;
the conductive layer on the dielectric structure that is on the top portion of the single-piece lid structure, on the dielectric structure that is on the side portion of the single-piece structure, and on the dielectric that is on the one or more fin structures forms a second capacitive plate; and
the first capacitive plate, the capacitor dielectric, and the second capacitive plate form a capacitor structure for the packaged electronic device.

12. The method of claim 11, wherein:
providing the conductive layer comprises providing the second portion of the conductive layer attached to the substrate using a conductive structure so that an outer edge of the single-piece lid structure and an inner edge of the conductive structure define a gap; and
the conductive layer comprises a third portion that overlaps the gap.

13. The method of claim 11, wherein:
attaching the single-piece lid structure comprises attaching the single-piece lid structure comprising a plurality of fins structures including at least one fin structure that is above the top side of the electronic device; and
the single-piece lid structure laterally surrounds the electronic device without a break.

14. The method of claim 11, wherein:
providing the dielectric structure comprises 3D printing the dielectric structure; and
3D printing the dielectric structure comprises using zirconium oxide in a polymeric suspension.

15. The method of claim 14, wherein:
the dielectric structure has a thickness in a range from about 2 microns through about 5 microns.

16. A method for forming a packaged electronic device, comprising:
providing a substrate;
electrically coupling an electronic device to the substrate;
providing a single-piece lid structure comprising a first portion, a second portion extending downward from the first portion, and a third portion extending laterally outward from the second portion;
attaching the third portion of the single-piece lid structure to the substrate using a conductive attachment layer so that the first portion overlies the electronic device and the second portion vertically overlaps sides of the electronic device in a cross-sectional view, wherein the single-piece lid structure vertically and horizontally encloses the electronic device;
after the step of attaching the third portion of the single-piece lid structure:
providing a dielectric structure on the first portion and the second portion of the single-piece lid structure; and
providing a conductive layer on the dielectric structure and overlying the first portion, the second portion, and the third portion of the single-piece lid structure, wherein the conductive layer is coupled to the substrate such that the conductive layer has a first part that overlaps the dielectric structure and a second part that is coupled to the substrate, wherein:
the first potion and the second portion of the single-piece lid structure form a first capacitive plate;

the dielectric structure on the first portion and the second portion of the single- piece lid structure forms a capacitor dielectric;

the conductive layer on the dielectric structure that is on the first portion and the second portion of the single-piece lid structure forms a second capacitive plate; and the first capacitive plate, the capacitor dielectric, and the second capacitive plate form a capacitor structure for the packaged electronic device.

17. The method of claim 16, wherein:

providing the conductive layer comprises providing the conductive layer coupled to the substrate using a second conductive structure;

an outer edge of the third portion of the single-piece lid structure and an inner edge of the second conductive structure define an air gap; and the conductive layer comprises a third part that overlaps the air gap.

18. The method of claim 16, wherein:

providing the single-piece lid structure comprises providing a stamped lid structure that is configured to surround the electronic device without a break.

19. The method of claim 16, wherein:

providing the dielectric structure comprises 3D printing the dielectric structure;

3D printing the dielectric structure comprises using zirconium oxide in a polymeric suspension; and the dielectric structure has a thickness in a range from about 2 microns through about 5 microns.

20. The method of claim 16, wherein:

providing the single-piece lid structure comprises providing the single-piece lid structure comprising a fin structure that extends outward from the first portion of the single-piece lid structure and forms part of the first capacitive plate; and providing the dielectric structure and the conductive layer comprises forming the dielectric structure and the conductive layer to cover the fin structure.

* * * * *